(12) United States Patent
Coquand et al.

(10) Patent No.: US 11,177,371 B2
(45) Date of Patent: Nov. 16, 2021

(54) TRANSISTOR WITH SUPERPOSED BARS AND DOUBLE-GATE STRUCTURE

(71) Applicant: Commissariat A L'Energie Atomique et aux Energies Alternatives, Paris (FR)

(72) Inventors: Remi Coquand, Grenoble (FR); Shay Reboh, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 41 days.

(21) Appl. No.: 16/535,367

(22) Filed: Aug. 8, 2019

(65) Prior Publication Data
US 2020/0058768 A1 Feb. 20, 2020

(30) Foreign Application Priority Data

Aug. 17, 2018 (FR) ...................... 18 57531

(51) Int. Cl.
*H01L 29/66* (2006.01)
*H01L 21/225* (2006.01)
(Continued)

(52) U.S. Cl.
CPC .... *H01L 29/66742* (2013.01); *H01L 21/2254* (2013.01); *H01L 21/30604* (2013.01);
(Continued)

(58) Field of Classification Search
CPC ........... H01L 21/2254; H01L 21/30604; H01L 29/6653; H01L 29/66545; H01L 29/66553;
(Continued)

(56) References Cited

U.S. PATENT DOCUMENTS 9,842,914 B1 12/2017 Yeung et al.
2004/0178451 A1 9/2004 Yagishita et al.
(Continued)

FOREIGN PATENT DOCUMENTS

WO WO 2006/051534 A1 5/2006

OTHER PUBLICATIONS

French Preliminary Search Report dated Jun. 28, 2019 in French Application 18 57531 filed Aug. 17, 2018 (with English Translation of Categories of Cited Documents).
(Continued)

*Primary Examiner* — Andrew Q Tran
(74) *Attorney, Agent, or Firm* — Oblon, McClelland, Maier & Neustadt, L.L.P.

(57) ABSTRACT

A method is provided for fabricating a double gate structure for transistors with superposed bars, including: providing, on a support, a stack including an alternation of one or several first bars based on a first semiconducting material, and one or several second bars based on a second semiconducting material; removing lateral portions of the second bars; forming insulating plugs in contact with lateral regions of the second bars; removing the first bars; and forming a gate electrode facing an upper face and a lower face of the second bars, the insulating plugs being arranged in contact with the lateral regions of the second bars when the gate electrode is being formed.

13 Claims, 5 Drawing Sheets

(51) Int. Cl.
*H01L 21/306* (2006.01)
*H01L 29/786* (2006.01)

(52) U.S. Cl.
CPC .... *H01L 29/6653* (2013.01); *H01L 29/66545* (2013.01); *H01L 29/66553* (2013.01); *H01L 29/78648* (2013.01); *H01L 29/78696* (2013.01)

(58) Field of Classification Search
CPC ......... H01L 29/66742; H01L 29/78648; H01L 29/78696
See application file for complete search history.

(56) References Cited

U.S. PATENT DOCUMENTS

| | | |
|---|---|---|
| 2005/0127412 A1 | 6/2005 | Cohen et al. |
| 2007/0126035 A1 | 6/2007 | Ernst et al. |
| 2008/0111195 A1* | 5/2008 | Atanackovic ....... H01L 29/4908 257/366 |
| 2015/0340457 A1 | 11/2015 | Xie et al. |
| 2017/0345915 A1 | 11/2017 | Coquand et al. |
| 2018/0033871 A1 | 2/2018 | Xie et al. |

OTHER PUBLICATIONS

Andrieu, F, et al., "Design Technology Co-Optimization of 3D-monolithic standard cells and SRAM exploiting dynamic back-bias for ultra-low-voltage operation", IEDM17, IEEE, 2017, pp. 497-500.
U.S. Appl. No. 14/575,329, filed Dec. 18, 2014, 2015/0179474 A1, Maitrejean, S, et al.
U.S. Appl. No. 15/452,049, filed Mar. 7, 2017, 2017/0263607 A1, Maitrejean, S, et al.
U.S. Appl. No. 15/852,050, filed Dec. 22, 2017, 2019/0198614 A1, Reboh, S, et al.
U.S. Appl. No. 15/837,281, filed Dec. 11, 2017, 2018/0175194 A1, Reboh, S, et al.
U.S. Appl. No. 15/852,648, filed Dec. 22, 2017, 2019/0198616 A1, Coquand, R. et al.
U.S. Appl. No. 16/054,524, filed Aug. 3, 2018, 2019/0051744 A1, Coquand, R, et al.

* cited by examiner

TRANSISTOR WITH SUPERPOSED BARS AND DOUBLE-GATE STRUCTURE

TECHNICAL DOMAIN AND STATE OF PRIOR ART

This invention relates to the field of microelectronics and transistors, and more particularly relates to transistors with a structure forming at least a channel in the form of a plurality of semiconducting bars located one above the others.

To enable electrostatic control of the channel, such a structure is typically associated with a gate electrode with an "encapsulation" type configuration, in other words that extends all around the bars, facing their top and bottom faces, but also laterally. Such a configuration generally gives better electrostatic control of the channel structure.

However in some cases, the presence of a completely encapsulating gate can cause problems, particularly for some bar dimensions and for some materials. In particular, making the channel structure conducting in different crystallographic plans can degrade the performances of the transistor. The mobility of the carriers and therefore in particular the output current performances can be directly impacted. Wedge effects inherent to the existence of two adjacent lateral faces can also degrade the electrostatic control of the transistor.

Therefore the problem arises of making an improved transistor structure with superposed semiconducting bars.

PRESENTATION OF THE INVENTION

A method of implementing this invention consists of providing a transistor with semiconducting bars located one above the others and a double-gate type gate electrode structure distributed on a top face and on a bottom face of the semiconducting bars, while lateral faces of the semiconducting bars are electrically insulated from the gate by means of insulation plugs that extend in contact with the lateral faces of the semiconducting bars.

The second bars that can form a channel or channels have insulated lateral surfaces, electrical conduction being limited to the upper and lower faces of the same crystallographic orientation. Therefore electrical conduction is inhibited on surfaces for which the physical behaviour is different from that of the upper and lower faces.

In particular, an embodiment includes the fabrication of a transistor structure comprising the following steps:

a) provide a stack comprising an alternation of one or several first bars made of a sacrificial material, on a support, particularly made of a semiconducting first material, and one or several second bars based on a second semiconducting material, b) remove lateral regions of the second bars by partial and selective etching of the second semiconducting material, so as to make them narrower and to release spaces on each side of the lateral faces of the second bars, c) form insulating plugs in said spaces in contact with the lateral faces of the second bars, d) remove the first bars by selective etching of the first semiconducting material so as to expose an upper face and a lower face of the second bars, e) form a gate electrode facing the upper face and the lower face of the second bars, the insulating plugs being arranged in contact with the lateral faces of the second bars when the gate is being formed.

With such a method, a gate is formed in contact with the upper and lower faces of the semiconducting bars, in other words faces with the same crystallographic orientation, while preventing electrostatic control of the bars at the lateral faces of the bars, in other words in zones with different crystallographic orientations, by means of insulating plugs. This can give an electrical behaviour similar to that of so-called "plane" transistor structures, and that is better.

Advantageously, a given (third) semiconducting material with a lattice parameter different from the second semiconducting material can be grown on the upper face and the lower face of the second bars, between step d) to remove the first bars and step e) to form the gate.

The given material that is grown is advantageously configured so as to strain the semiconducting bars forming at least a channel region or configured so as to be self-strained. The insulating plugs are kept during this growth and prevent growth of said given semiconducting material on the lateral faces of the second bars. Epitaxial growth is facilitated by the fact that it is only done on the same type of crystalline plane. Thus, this avoids possible defects that might be created by growth on lateral planes that have a different crystallographic orientation. The second bars are strained on the upper and lower faces with the same crystallographic orientation, which can increase the benefit of this strain and improve the electrical performances of the transistor. With such an embodiment, strain can be added preferentially in the electrical transport plane.

The given semiconducting material that is made to grow can advantageously be based on germanium.

In this case, before the gate is formed, at least one thermal annealing or controlled oxidation can be made so as to diffuse germanium in said second bars. Such an embodiment makes it possible to adapt the voltage threshold of the transistor by changing the chemical nature of the channel(s).

As a variant, when the given grown semiconducting material is based on germanium, the gate can be formed on portions of the given semiconducting material located on the upper face and the lower face of the second bars.

A "core-shell" type configuration can thus be kept with the second bars forming a semiconducting core surrounded by the given semiconducting material forming a shell with a different composition around this core, the gate then being located in contact with this shell.

According to a particular embodiment, the method may also include the steps described below, between step c) to form insulating plugs and step d) to remove the first bars:
  make a dummy gate,
  form isolating spacers on each side of the dummy gate,
  selectively remove end portions of the first bars so as to reduce their length and release spaces on each side of end regions of the first bars,
  form internal insulating spacers within said spaces.

Advantageously, the method can then also include the following steps, after formation of the internal insulating spacers and before step d) to remove the first bars:
  form source and drain regions,
  form at least one encapsulation layer on the source and drain regions,
  remove the dummy gate.

Advantageously, the insulating plugs are made of a dielectric material with a dielectric constant equal to less than 7.

The insulating plugs may be made of a dielectric material chosen from among the following materials: SiBCN, $SiO_2$, SiN, $Si_3N_4$.

Preferably, the insulating plugs are made of a given dielectric material, the selective etching of the first semiconducting material in the removal step d) being selective with regard to the given dielectric material.

According to a particular embodiment when the second bars are made of silicon, the upper face and the lower face of the second bars can have an orientation corresponding to the crystallographic plane (100).

In particular, the method can be applied for second semiconducting bars that are wider then their thickness, and is particularly advantageous for second bars more than 20 nm wide.

According to another aspect, an embodiment relates to a transistor structure obtained using a method like that defined above or a structure comprising:

- a stack with an alternation of one or several first bars made of a first semiconducting material and one or several second bars based on a second semiconducting material, central portions of the second bars forming at least one channel of said transistor,
- a gate electrode in front of an upper face and a lower face of central portions of the second bars,
- insulating plugs arranged between the gate electrode and lateral faces of said central portions of the second bars based on the second semiconducting material.

BRIEF DESCRIPTION OF THE DRAWINGS

This invention will be better understood after reading the description of example embodiments given purely for information and that are in no way limitative, with reference to the appended drawings on which.

Identical, similar or equivalent parts of the different figures have the same numeric references to facilitate the comparison between the different figures.

The different parts shown on the figures are not necessarily all at the same scale to make the figures more easily understandable.

Furthermore, in the following description, terms that are dependent on the orientation such as "on", "above", "top", "bottom", "lateral", etc. of a structure should be understood assuming that the structure is oriented as shown on the figures.

DETAILED PRESENTATION OF PARTICULAR EMBODIMENTS

Figures 1A, 1B:
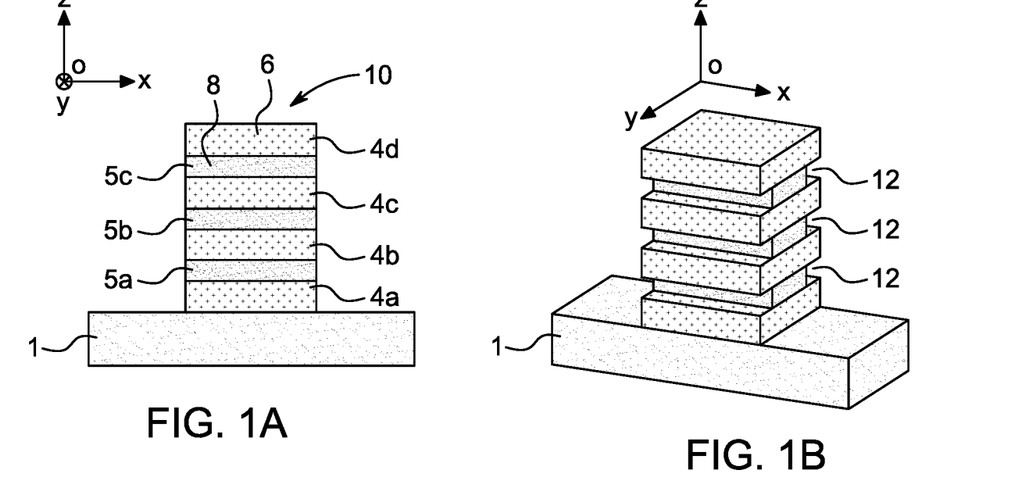
FIGS. 1A-1D illustrate an example of a method of fabricating a structure for a transistor channel and with semiconducting bars located one above the others, insulating plugs being arranged on each side of the bars.

Refer to FIG. 1A that gives an example of a semiconducting structure with superposed semiconducting bars from which a transistor channel structure can be formed.

The structure 10 can be made on a substrate 1 of the type commonly called "bulk" formed from a semiconducting layer or may be a semiconductor on insulator type substrate, for example of the SOI type comprising an semiconducting support layer covered by an insulating layer based for example on $SiO_2$, itself covered with a thin surface semiconducting layer, for example made of silicon.

The structure 10 comprises a stack with an alternation of layers based on a sacrificial material 6, typically a first semiconducting material, and layers based on a second material 8 that is semiconducting and is different from the first material 6. The material 6 can be etched selectively with regard to the second semiconducting material 8. The second semiconducting material 8 can also be etched selectively relative to the first semiconducting material 6. For example, the first material 6 is based on silicon germanium, while the second material 8 is made of silicon. Such a stack can be made by successive epitaxies of semiconducting layers.

The stacked layers structure represented on FIG. 1A in this case is a structure obtained after etching, the etched layers typically comprising portions in the form of bars. The structure is thus formed from an alternation of bars 4a, 4b, 4c, 4d based on the first material 6 and bars 5a, 5b, 5c based on the second material 8. The stacked bars 4a, 5a, 4b, 5b, 4c, 5c, 4d that are indifferently called "nanowires", "nanosheets" may for example be in the form of a parallelepiped or approximately a parallelepiped. The thickness of the bars 5a, 5b, 5c may typically be between 4 and 12 nm, for example between 6 nm and 8 nm.

The width of the bars is typically more than their thickness (dimension measured along a direction parallel to the principal plane of the substrate and particularly to the y axis of an [O; x; y; z] orthogonal coordinate system, the principal plane of the substrate being a plane of the substrate defined on FIG. 1A as a plane parallel to the [O; x; y] plane). The thickness e is typically between 6 nm and 10 nm while the width can for example be between 6 nm and 100 nm.

The next step is partial etching of portions of the stacked structure that can be isotropic and selective, so as to partially remove some of the bars 5a, 5b, 5c in the stack. In this example, the bars based on the second material 8 are removed in preference 8. Etching is preferably selective isotropic etching of the second semiconducting material 8 with regard to first material 6. For example, in the case in which the bars 5a, 5b, 5c are based on Si while the bars 4a, 4b, 4c, 4d are based on SiGe, etching can be an isotropic etching of Si, selective with regard to SiGe, such etching can be made for example by wet etching using ammonia ($NH_3$).

This is how the width of the bars 5a, 5b, 5c is reduced. This width reduction can be between one and several nanometres, for example of the order 1 to 3 nm. Once the reduction has been made, the bars 5a, 5b, 5c may have a width W for example more than 20 nm and less than 100 nm, typically between 15 nm and 50 nm.

The result thus obtained is a stack comprising an alternation of bars 4a, 4b, 4c, 4d based on the material 6 and bars based on the semiconducting material 8 with smaller lateral dimensions that those of bars 4a, 4b, 4c, 4d.

Due to the difference in lateral dimensions firstly between bars 4a, 4b, 4c, 4d and secondly bars 5a, 5b, 5c, the structure comprises a toothed profile, with notches 12 or grooves 12 at its lateral flanks.

These notches or grooves 12 form spaces on each side of the lateral faces of the bars 5a, 5b, 5c that are filled by a dielectric material (or on which this material is formed) for example such as silicon nitride (SiN, $Si_3N_4$, $Si_xN_y$), or silicon oxide ($SiO_2$) or SiBCN.

Figure 1C:
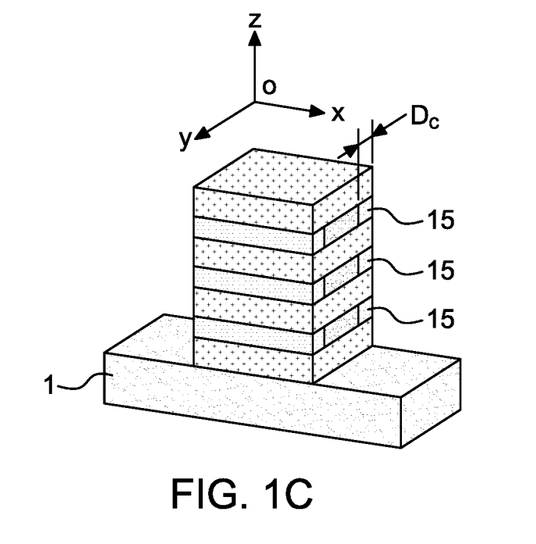
Figure 1D:
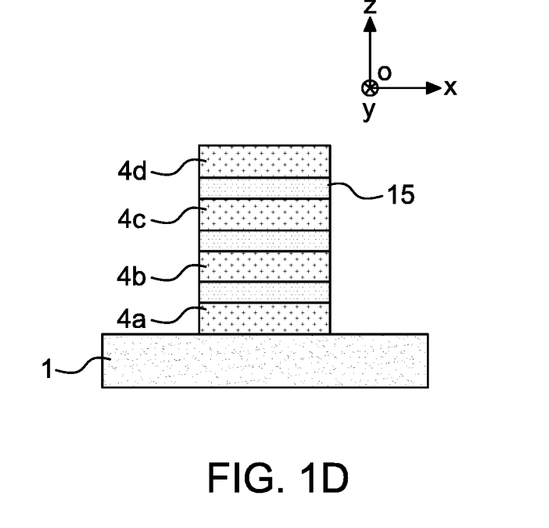

The dielectric material, deposited for example in a conforming manner, is then etched so as to make insulating plugs 15 on each side of the bars based on a semiconducting material 8 (FIG. 1C giving a perspective view and FIG. 1D giving a cross-sectional view). The insulating plugs 15 have a width Dc that can be several nanometres and that correspond to the depth of the notches or grooves 12.

The insulating plugs 15 can subsequently be used as masking elements preventing epitaxial growth on the second bars 5a, 5b, 5c made of a semiconducting material 8. The insulating plugs 15 may also form a lateral electrical insulation between the stacked semiconducting structure and a gate electrode. In this case, plugs are preferably chosen made of a dielectric material with a low dielectric constant, particularly less than 7.

Figure 2A:
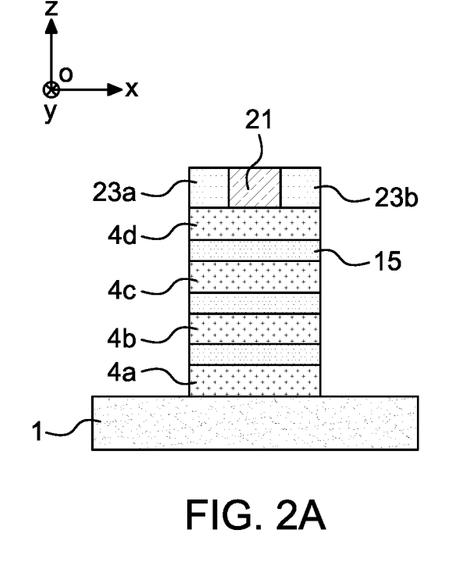
FIGS. 2A-2G illustrate the use of a double gate for the channel structure with semiconducting bars.

The next step (FIG. 2A) is to form a dummy gate 21, for example made of polysilicon and insulating spacers 23a, 23b called "external" spacers on each side of the dummy gate 21. The insulating spacers 23a, 23b are based for example on silicon nitride (SiN) or SiCN. The insulating spacers 23a, 23b can advantageously be formed based on a dielectric material different from that formed by insulating plugs 15. The insulating spacers 23a, 23b and the sacrificial gate 21 thus cover at least a central zone of the stack of semiconducting bars (FIG. 1B).

Typically, external spacers 23a, 23b are etched so as to further etch the ends of the structure and expose its flanks.

Figure 2B:
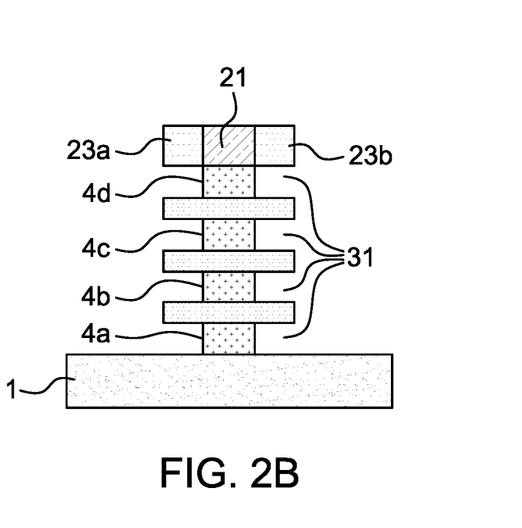

The next step can then be to make insulating spacers called "internal" spacers. This is done by firstly selective etching of portions of the first material 6, in this case end portions of the first bars 4a, 4b, 4c, 4d (FIG. 2B). Removal of the first material 6 exposes spaces 31 forming cavities, that are then filled with a dielectric material 33 for example based on silicon nitride (FIG. 2C).

Figure 2C:
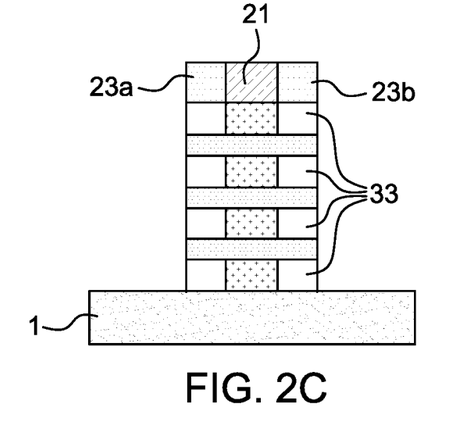

A thickness of this dielectric material 33 can then be removed in zones on each side of the spacers 23a, 23b. An anisotropic method is chosen in preference so as to keep the dielectric in the cavities and remove excess outside these cavities. This removal can be done for example by means of a wet process based on phosphoric acid so as to keep regions made of dielectric material 33 around the ends of the bars 4a, 4b, 4c, 4d. These regions made of dielectric material 33, also called "internal spacers" preferably have an external face aligned with the face of external spacers 23a, 23b, as in the example illustrated in FIG. 2C.

Source and drain semiconducting blocks 45a, 45b can then be formed. These blocks 45a, 45b can then be made for example by epitaxial growth and initiate at least on one portion of the bars 5a, 5b, 5c of semiconducting material 8. The semiconducting blocks 45a, 45b are made, for example, from silicon. The semiconducting material 8 can be doped, particularly during its growth.

Figure 2D:
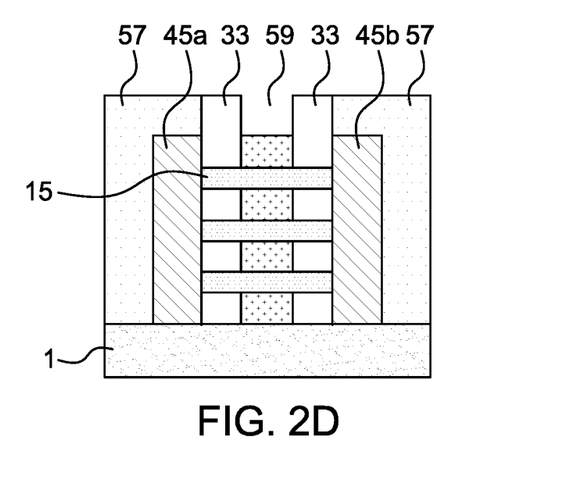

A layer 57 also called an "encapsulation" layer 57 is then formed so as to cover the structure (FIG. 2D). The encapsulation layer 57 is preferably insulating and for example may be based on silicon oxide. A step to remove a thickness from this mask layer 57, for example by CMP (Chemical Mechanical Planarisation), can then be performed stopping at the summit or the top face of the sacrificial gate 21.

An opening 59 is then made so as to once again expose a central region of the stack of semiconducting bars (FIG. 2D). This opening 59 is formed by removing the sacrificial gate 21. When the sacrificial gate 21 is made of polysilicon, it can be removed for example by wet etching using a solution based on ammonia, stopping on the sacrificial gate dielectric, that can then be removed in the opening 59, for example by etching using hydrofluoric acid for the typical case of a dielectric based on silicon oxide.

The first material 6 is then removed in the opening 59.

In particular, selective etching of the first material 6 with regard to the second material 8 is then made. Etching is also selectively with regard to the material of the insulating plugs 15. Central portions of the first bars 4a, 4b, 4c, 4d located in the opening 59 are thus removed.

Preferably, etching is also selective with regard to the material(s) of the internal spacers 33 and external spacers 23a, 23b. A selective removal can be made, for example by chemical vapour phase etching, for example using HCl.

In the case in which the removed material 6 is $Si_{1-a}Ge_a$. The result obtained in the opening 59, is thus suspended bars 5a, 5b, 5c based on the semiconducting material 8, in this example silicon, and covered on their lateral faces by insulating plugs 15.

Figures 2E, 2F, 2G:
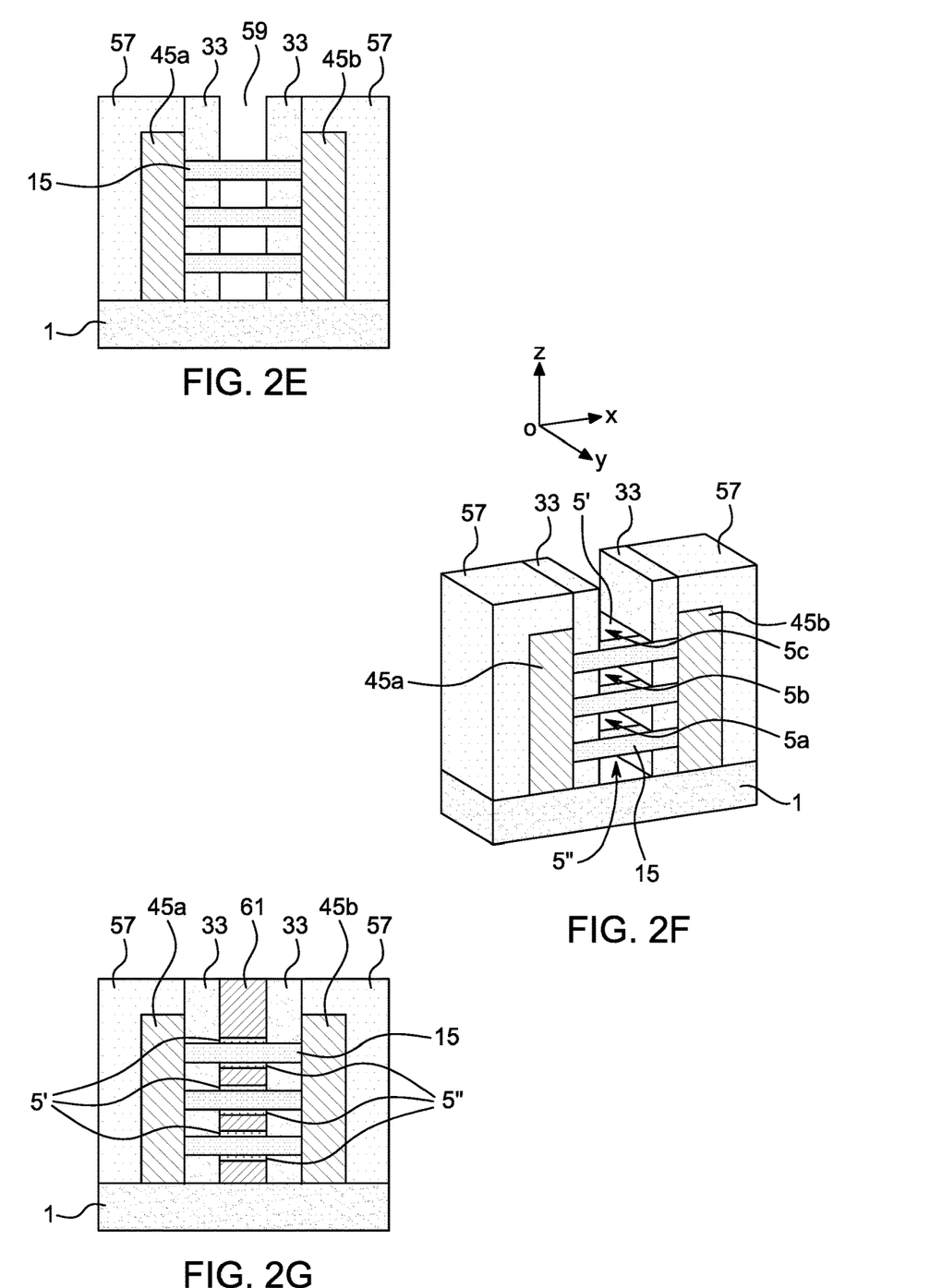

The bars 5a, 5b, 5c based on the semiconducting material 8 advantageously have a central portion that is not covered by another material, such that an empty space is formed above and below the central portion of the bars 5a, 5b, 5c based on the semiconducting material 8 (FIG. 2E).

It is then possible to deposit at least one layer of gate dielectric, for example a stack of $SiO_2$ and $HfO_2$. In particular, this layer covers an upper face 5' and a lower face 5" of bars. At least one gate material, for example such as TiN and W, is then deposited. A gate 61 is thus formed facing the upper face 5' and the lower face 5" of the second bars 5a, 5b, 5c (the central portion of these second bars 5a, 5b, 5c forming the channel), while keeping plugs acting as electrical insulation in contact with the lateral faces of the second bars 5a, 5b, 5c (FIGS. 2F and 2G). The fabricated gate 61 in this case is not a fully encapsulating gate enabling electrostatic control of the semiconducting bars 5a, 5b, 5c on 3 dimensions, but rather a double gate, provided that the insulating plugs 15 isolate the lateral faces of the semiconducting bars 5a, 5b, 5c with regard to the gate 61.

Figure 3A:
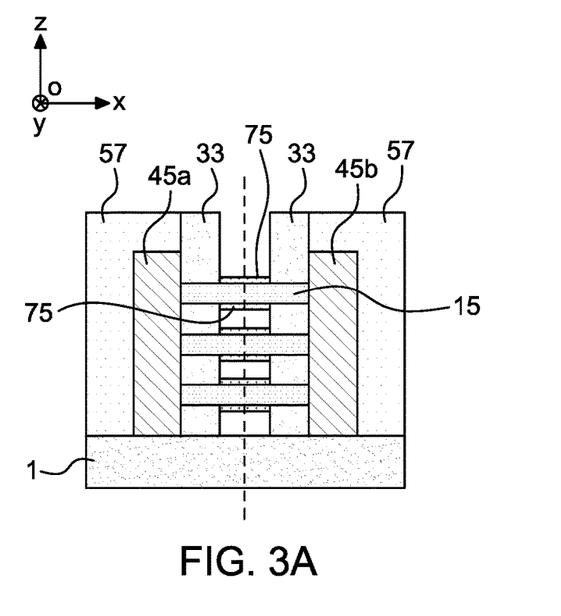
FIGS. 3A-3B illustrate a variant embodiment for which a semiconducting material is grown on the upper and lower faces of the bars, lateral growth being inhibited by the insulating plugs.
Figure 3B:
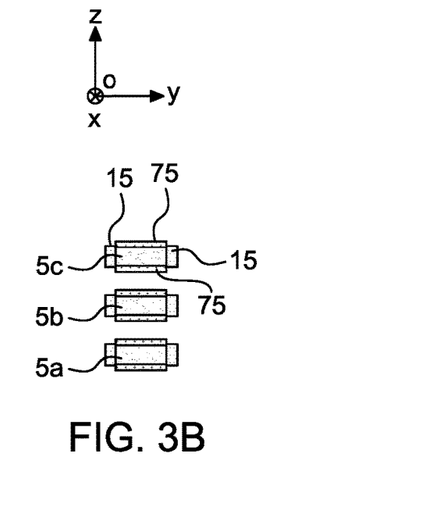

According to a variant of the example embodiment that has just been described, after the step to remove the first bars, it is advantageous to make epitaxial growth of the semiconducting material 75 on an upper face and on a lower face of the second bars 5a, 5b, 5c (FIGS. 3A and 3B). The insulating plugs 15 then prevent lateral growth of the semiconducting material. The material 75 is typically chosen so as to have a lattice parameter different from that of the material 8 of the second bars 5a, 5b, 5c in order to strain them.

For example, the semiconducting material 75 that is grown may be based on $Si_{1-x}Ge_x$ when the second bars 5a, 5b, 5c are made of silicon. The added thickness may for example be between 1 nm and 5 nm, typically of the order 3 nm.

In this case, $Si_{1-x}Ge_x$ is grown on planes (100) while preventing growth on the planes (110). A uniform growth rate and growth method can be maintained to obtain a good quality crystalline semiconducting material 75 with a uniform thickness on the bars 5a, 5b, 5c.

According to a variant, a thickness of the second bars 5a, 5b, 5c made of Si can be removed for example by oxidation/deoxidation, and then replaced by $Si_{1-x}Ge_x$ with the same thickness as the removed thickness, so as to have second bars with approximately the same dimensions as before partial removal but composed of different semiconducting materials in a core-shell configuration.

A double gate can then be formed on such a structure. In this case, the bars 5a, 5b, 5c are kept with a structure comprising a core and an envelope made of different semiconducting materials.

Figure 4:
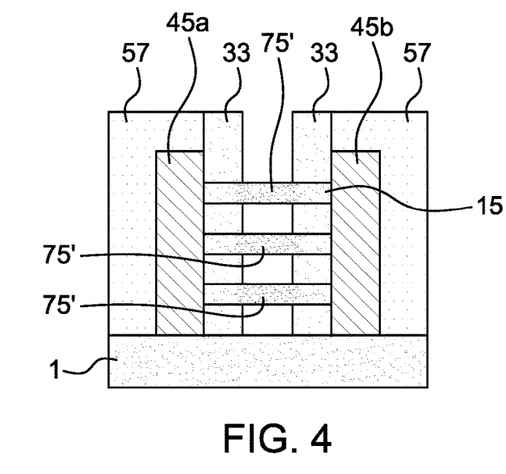
FIG. 4 illustrates a step of germanium enrichment of the semiconducting bars.

As a variant (FIG. 4), germanium 75' is diffused from the material 75 in the second bars 5a, 5b, 5c before the double gate is formed. To achieve this, one or several controlled thermal annealings or oxidations are performed. For example, at least one annealing can be done at a temperature between 400° C. and 1100° C. for a duration that can vary between 0.5 second and several seconds.

Figure 5:
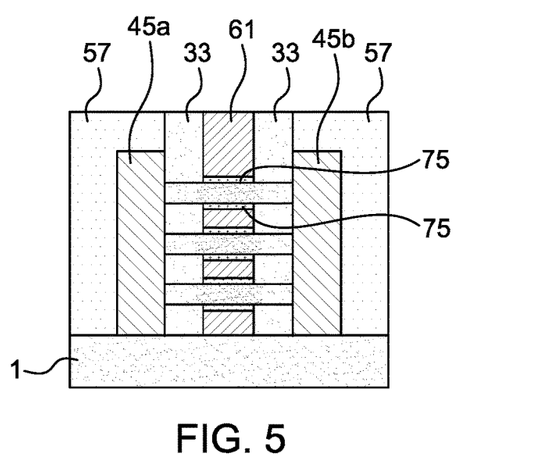
FIG. 5 illustrates a transistor structure with bars located one above the others and strained, and a gate electrode with a double-gate type layout.

Another variant (FIG. 5) includes thinning of the bars 5a, 5b, 5c, for example by etching using ammonia or a derivative, before growth of the material 75. This thinning may be of the order of several nanometres, for example between 1 and 3 nm. Once thinning is complete, epitaxial growth of the material 75 can be started possibly followed by enrichment when the material 75 contains germanium.

Figure 6A:
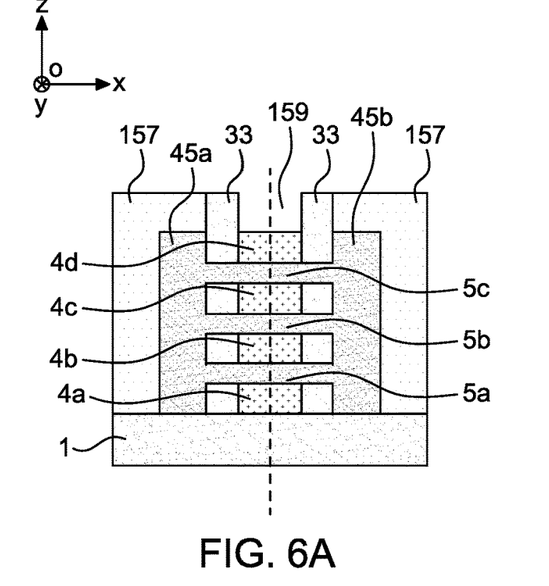
FIGS. 6A-6E illustrate a variant of the method of making a double gate structure for a channel structure with superposed semiconducting bars.

A variant of the method includes production of insulating plugs 15 after formation of source and drain blocks 45a, 45b, a dummy gate, insulating spacers 23a, 23b and an encapsulation layer 157 to protect the source and drain blocks 45a, 45b. In the example embodiment in FIG. 6A, the sacrificial gate is removed and a cavity 159 is formed exposing a central region of the stack of first bars and second bars 4a, 5a, 4b, 5b, 4c, 5c, 4d.

Figure 6B:
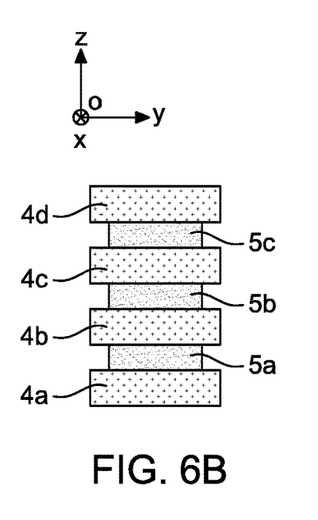

Then (FIG. 6B giving a cross-sectional view of the stack inside the cavity 159), partial etching of the lateral portions of the second bars 5a, 5b, 5c of the stack is made, to reduce their width with regard to the first bars 4a, 4b, 4c, 4d.

Figure 6C:
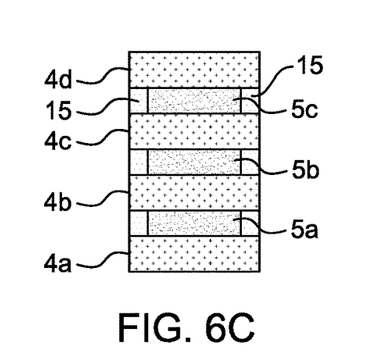

Insulating plugs 15 are then made in contact with the lateral faces of the bars 5a, 5b, 5c, by deposition of a dielectric material and then etching of this dielectric material (FIG. 6C).

Figure 6D:
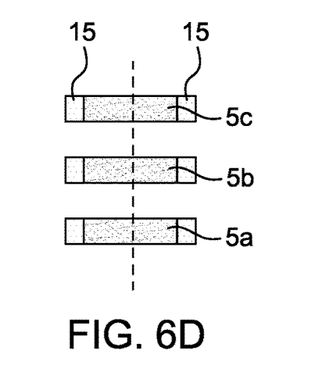
Figure 6E:
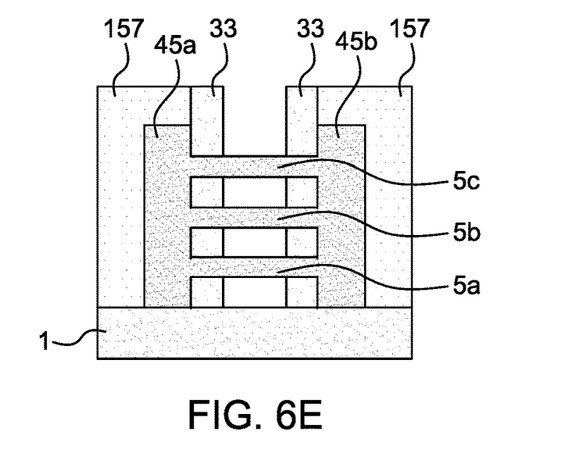

Then, the first bars 4a, 4b, 4c, 4d are removed in the cavity 159 (FIGS. 6D and 6E).

A semiconducting material with a lattice parameter different from that of the material used for the second bars can then be grown to strain the second bars, and the gate structure is then made by depositing at least one gate dielectric and at least one gate material in the cavity 159. As a variant, it is possible to make the double gate structure directly.

The invention claimed is:

1. A method of making a structure for transistors, comprising the following steps:
   a) providing, on a support, a stack comprising an alternation of one or several first bars made of a sacrificial material based on a first semiconducting material, and one or several second bars, configured to form a channel region of a transistor and based on a second semiconducting material;
   b) removing lateral regions of the second bars by partial and selective etching of the second semiconducting material, so as to make the second bars narrower and to release spaces on each side of lateral faces of the second bars;
   c) forming insulating plugs in the spaces in contact with the lateral faces of the second bars;
   d) removing a central portion of the first bars by selective etching of the first semiconducting material so as to expose an upper face and a lower face of the second bars; and
   e) forming a double-gate electrode facing the upper face and the lower face of the second bars, the insulating plugs being arranged in contact with the lateral regions of the second bars when the double-gate electrode is being formed.

2. The method according to claim 1, further comprising, between step d) and step e), growing a third semiconducting material, with a lattice parameter different from the second semiconducting material, on the upper face and the lower face of the second bars, wherein the insulating plugs are configured to prevent growth of the third semiconducting material on the lateral faces of the second bars.

3. The method according to claim 2, wherein the third semiconducting material is based on germanium, and further comprising, before the double-gate electrode is formed, performing at least one thermal annealing or at least one oxidation so as to diffuse germanium into the second bars.

4. The method according to claim 2, wherein the third semiconducting material is based on germanium, and wherein the double-gate electrode is formed on portions of the third semiconducting material located on the upper face and on the lower face of the second bars.

5. The method according to claim 2, wherein the second bars are thinned prior to growth and by a thickness that is equal to a thickness of the third semiconducting material that is grown.

6. The method according to claim 1, further comprising, between step c) and step d), the following additional steps:
   forming a dummy gate;
   forming isolating spacers on each side of the dummy gate;
   selectively removing end portions of the first bars so as to reduce a length of the first bars and to release spaces on each side of end regions of the first bars; and
   forming internal insulating spacers within said spaces.

7. The method according to claim 6, further comprising, after the forming of the internal insulating spacers and before step d), the following additional steps:
   forming source and drain regions;
   forming at least one encapsulation layer on the source and drain regions, the encapsulation layer being arranged so as to expose the dummy gate; and
   removing the dummy gate.

8. The method according to claim 1, the insulating plugs being made of a dielectric material with a dielectric constant less than 7, and/or chosen from among the following dielectric materials: SiBCN, $SiO_2$, SiN, and $Si_3N_4$.

9. The method according to claim 1, the insulating plugs being made of a dielectric material, and the selective etching of the first semiconducting material in step d) being selective with regard to the dielectric material.

10. The method according to claim 1, wherein the second bars are made of silicon, and wherein the upper face and the lower face of the second bars have an orientation corresponding to a same crystallographic plane.

11. A transistor structure comprising, on a support:
   a stack comprising an alternation of one or several bars, spaced apart from each other, and based on a semiconducting material, central portions of the bars forming a channel region of a transistor;
   a gate dielectric covering an upper face and a lower face of the central portions of the bars;
   a double-gate electrode in front of the upper face and the lower face of the central portions of the bars; and insulating plugs arranged in contact with lateral faces of the central portions of the bars, the insulating plugs being further arranged between the double-gate electrode and the lateral faces of the central portions of the bars so as to isolate the lateral faces of the central portions of the bars from the double-gate electrode.

12. The transistor structure according to claim 11, wherein insulating spacers arranged on opposing sides of the double-gate electrode and extending continuously from an upper face of an uppermost bar of the stack to a same level as an upper face of the double-gate electrode.

13. The transistor structure according to claim 12, wherein the insulating spacers also extend at least along the upper face of the uppermost bar of the stack in a direction orthogonal to a direction of the insulating plugs extending along the lateral faces of the central portions of the bars.

\* \* \* \* \*